United States Patent
Wilson et al.

(10) Patent No.: US 6,693,946 B2
(45) Date of Patent: Feb. 17, 2004

(54) WAVELENGTH-TUNABLE LASERS

(75) Inventors: William Larry Wilson, Somerville, NJ (US); Jin Z. Zhang, San Jose, CA (US)

(73) Assignee: Lucent Technologies Inc., Murray Hill, NJ (US)

( * ) Notice: Subject to any disclaimer, the term of this patent is extended or adjusted under 35 U.S.C. 154(b) by 61 days.

(21) Appl. No.: 09/929,311

(22) Filed: Aug. 14, 2001

(65) Prior Publication Data

US 2003/0035459 A1 Feb. 20, 2003

Related U.S. Application Data

(60) Provisional application No. 60/303,259, filed on Jul. 5, 2001.

(51) Int. Cl.⁷ ................................................. H01S 3/10
(52) U.S. Cl. ............................. 372/102; 372/92; 372/97
(58) Field of Search .............................. 372/97, 92, 102

(56) References Cited

U.S. PATENT DOCUMENTS

| 4,689,065 | A | * | 8/1987 | Krause ............................... 65/2 |
| 5,574,742 | A | | 11/1996 | Ben-Michael et al. ......... 372/45 |
| 5,870,417 | A | | 2/1999 | Verdiell et al. ................. 372/32 |
| 6,041,070 | A | * | 3/2000 | Koch et al. ...................... 372/6 |
| 6,320,888 | B1 | * | 11/2001 | Tanaka et al. ................. 372/32 |
| 6,389,047 | B1 | * | 5/2002 | Fischer .......................... 372/32 |

FOREIGN PATENT DOCUMENTS

JP        2000194023 A  *  7/2000  ............. G02F/1/35

OTHER PUBLICATIONS

U.S. patent application Ser. No. 09/608,639, Chen et al., filed Jun. 30, 2000.

* cited by examiner

Primary Examiner—James Dave
(74) Attorney, Agent, or Firm—John F. McCabe

(57) ABSTRACT

A semiconductor laser includes first and second laser cavities. The first and second cavities share a common optical gain medium and lase at different wavelengths.

20 Claims, 4 Drawing Sheets

WAVELENGTH-TUNABLE LASERS

This application claims the benefit of U.S. Provisional Patent Application No. 60/303,259, filed Jul. 5, 2001.

BACKGROUND OF THE INVENTION

1. Field of the Invention

The invention relates to lasers.

2. Discussion of the Related Art

In optical communications, the use of wavelength division multiplexing (WDM) to enable high bandwidth communication is expanding. A WDM system simultaneously transmits several distinct communications over one fiber by transmitting the communications in different wavelength channels. The wavelength channels are typically closely spaced to more efficiently use wavelength ranges for which the optical fiber has better transmission properties, e.g., lower attenuation.

The need for low cost and closely spaced wavelength channels poses challenges to the development of WDM systems. In particular, WDM transmitters have to produce output wavelengths that do not drift between the different wavelength channels. Unfortunately, the output wavelengths of the semiconductor lasers typically used in WDM transmitters tend to drift unless complex and expensive temperature controls are added. The drift results from temperature variations in laser cavities that lead to changes in the optical properties of the semiconductor medium therein.

Another problem in WDMs relates to the need for multichromatic transmitters. Such transmitters are able to transmit light in multiple wavelength channels of the WDM system concurrently. Disadvantageously, multi-chromatic transmitters are usually more complex and high cost.

SUMMARY OF THE INVENTION

A multi-chromatic laser embodying the principles of the invention features multiple laser cavities that share a common gain medium. The laser may include several wavelength-selective reflectors with different characteristic reflection wavelengths as an advantageous way of enabling the multiple cavities to share the common gain medium. Such a laser can be used, for example, as a multi-chromatic light source for an optical transmitter in a WDM or other optical network. Such transmitters are typically less complex than prior art multi-chromatic optical transmitters.

One embodiment of the invention features a so-called external cavity laser in which the laser cavity includes an internal waveguide and an external waveguide that is serially connected to the internal waveguide. The external waveguide has cascaded first and second wavelength-selective reflectors for reflecting first and second wavelengths, respectively. The first and second reflectors define the multiple laser cavities.

BRIEF DESCRIPTION OF THE DRAWINGS

In the Figures, like reference numbers indicate like elements.

DETAILED DESCRIPTION OF THE INVENTION

Several approaches have been tried for economically stabilizing the output wavelengths of such lasers. One approach to temperature stabilization involves linearly coupling an external fiber to one output of a semiconductor optical amplifier. The amplifier includes an internal optical waveguide that provides optical gain when pumped. The internal waveguide couples at one end to the output of the amplifier and at a second end to a reflector. The external fiber forms a linear extension of the internal optical waveguide. The external fiber also contains an external Bragg grating. The Bragg grating reflects light of a particular wavelength and thereby provides the optical feedback needed to close a laser optical cavity that is formed by the fiber and the internal optical waveguide. Positioning the Bragg grating external to the optical gain medium makes the lasing wavelength less sensitive to temperature variations in general because of the high temperature-stability of silica-glass gratings.

Lasers in which a part of a laser cavity is external to a semiconductor structure housing the laser's optical gain medium are generally referred to as external cavity lasers.

Figure 1:
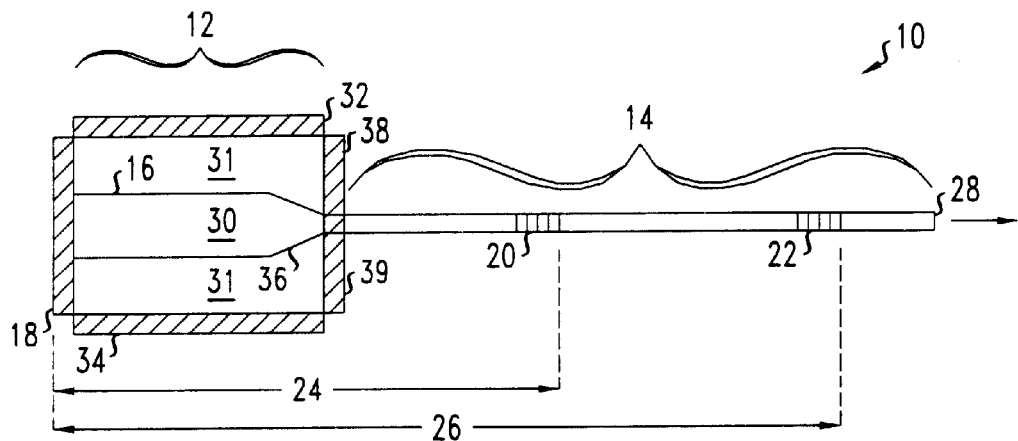
FIG. 1 shows an external cavity laser that embodies the principles of the invention by having two laser cavities that share a common optical gain medium.

FIG. 1 shows an external cavity laser 10 that is capable of simultaneously lasing at two wavelengths. The laser 10 includes a monolithic semiconductor structure 12 and an external silica-glass waveguide 14, e.g., an optical fiber or planar waveguide. The semiconductor structure 12 includes an internal semiconductor waveguide 16 having one end that is terminated by a reflector 18, e.g., a reflective layer or a cleaved facet. The other end of the waveguide 16 serially couples to the silica-glass waveguide 14. The silica-glass waveguide 14 includes first and second Bragg gratings 20, 22 with different line spacings. Exemplary Bragg gratings 20, 22 include gratings in the waveguide 14 and waveguides external to the waveguide 14. The first and second Bragg reflectors 20, 22 and the reflector 18 form end reflectors of two optical Fabry-Perot cavities 24, 26 that share a common optical gain medium in semiconductor waveguide 16.

Bragg gratings 20 and 22 are optical reflectors that reflect light whose wavelengths are an integer multiple of the gratings' characteristic reflection wavelengths $\lambda_{B1}$ and $\lambda_{B2}$, respectively.

Figure 2A:
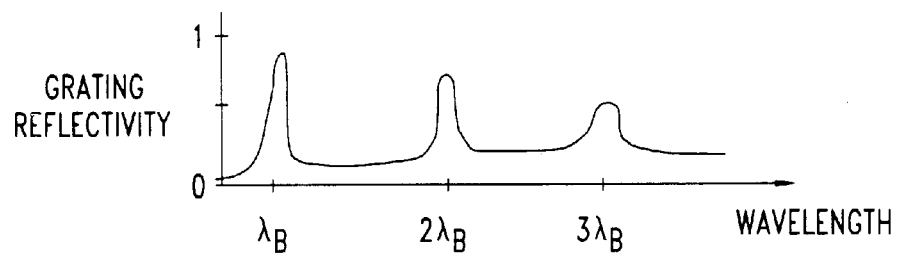
FIG. 2a is a graph illustrating the spectral reflectivity of a generic Bragg grating.

FIG. 2A shows the reflectivity of a generic Bragg grating. The Bragg grating has a large reflectivity at a characteristic reflection wavelength $\lambda_B$ and at integral multiples of the wavelength $\lambda_B$. The Bragg grating only very weakly reflects light at other wavelengths. A Bragg grating's characteristic reflection wavelength is $\lambda_B = 2$ nL where L is the repeat period for grating features and "n" is the index of refraction.

Figure 2B:
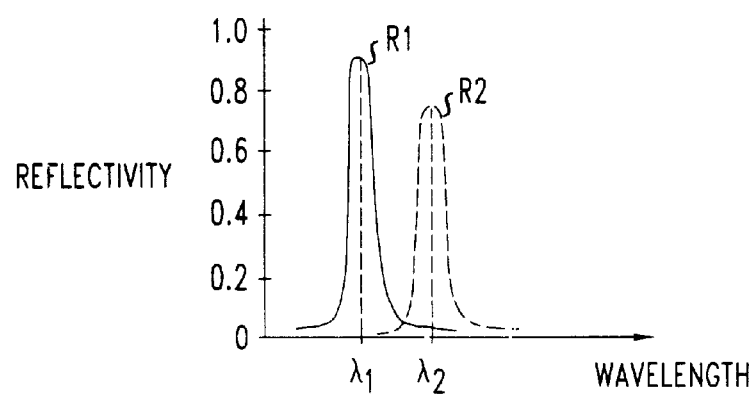
FIG. 2b shows reflectivities of the two Bragg gratings used in an external cavity laser of the type shown in FIG. 1.

Referring to FIG. 2B, cascaded Bragg gratings 20, 22 of FIG. 1 have different periods, i.e., $L_1 \neq L_2$. Thus, these Brag gratings 20, 22 have different characteristic reflection wavelengths, i.e., $\lambda_{B1} \neq \lambda_{B2}$. Thus, the reflectivities R1, R2 of the two Bragg gratings 20, 22 do not have high values for the same wavelengths. Bragg gratings 20, 22 do not reflect back significant amounts of light at the same wavelengths.

Referring to FIG. 1, since the two Bragg gratings 20, 22 do not reflect significant amounts of light at the same wavelengths, the two optical cavities 24, 26 lase at different wavelengths. Thus, laser 10 lases at two different wavelengths, e.g., $\lambda_1$ and $\lambda_2$, and can simultaneously produce light of both wavelengths at optical output 28. Since the characteristic reflection wavelengths are fixed by the gratings' periods $L_1$ and $L_2$, the two wavelengths, $\lambda_1$ and $\lambda_2$ can have close values, e.g., neighboring wavelength channels of a WDM system, if the two grating periods for Bragg gratings 20 and 22 are appropriately selected.

Still referring to FIG. 1, semiconductor waveguide 16 includes a core 30 and guiding layers 31. The core 30 includes the optical gain medium that generates light spontaneously in response to being current-pumped via metal contacts 32, 34. The guiding layers 31 have a lower refractive index than the core 30 and thus, strongly guide light to propagate along the longitudinal axis of the core 30.

In exemplary lasers 10, structure 12 is a composite of doped semiconductor layers, e.g., InGaAsP or another group III–V semiconductor. Some such semiconductor structures are disclosed in U.S. Pat. Nos. 5,574,742 and 5,870,417, which are incorporated by reference in their entirety. Other constructions of semiconductor structure 12 are well-known in the art.

To improve the optical coupling between the internal and external waveguides 16, 14, structure 12 includes a beam expander/contractor region 36 and an anti-reflection layer 38.

The beam expander/contractor region 36 expands or contracts the diameter of the fundamental propagation mode in the internal waveguide 16 to match the diameter of the fundamental propagation mode in the external waveguide 14. This matching of the diameters improves the optical coupling between the internal and external waveguides 16, 14 and decreases the dependence of the coupling on the precision of the alignment between the waveguides 14, 16 at surface 40. Beam expanders/contractors and antireflection layers are further described in co-pending U.S. patent application Ser. No. 09/608,639, filed Jun. 30, 2000, commonly assigned, which is incorporated herein by reference in its entirety.

The anti-reflection layer 38 suppresses back reflections of light from surface 40. Reducing back reflections at surface 40 improves the coupling between internal and external waveguides 16, 14. The absence of back reflections at surface 40 also insures that internal waveguide 16 does not function as a Fabry-Perot cavity that is closed by reflector 18 and surface 40. The Bragg gratings 20, 22 stabilize the output wavelengths of cavities 24, 26 from such temperature fluctuations, because the output laser wavelengths are fixed to the characteristic reflection wavelengths of the gratings 20, 22.

One end of external waveguide 14 is physically fixed adjacent end surface 40 so that light exiting internal waveguide 16 via beam expander/contractor 36 enters into the waveguide 14. Using the beam expander/contractor 36 eliminates the need for other coupling optics between the two waveguides 14, 16. The light exiting the internal waveguide 16 is simply directed into the polished end of the external waveguide 14. Exemplary waveguides 14 include an optical fiber positioned in a V-groove (not shown) to be aligned normal to the end surface 40 and a planar waveguide positioned normal to the end surface 40. In some embodiments, an index-matching medium is placed between the waveguide 14 and the structure 12 to further reduce reflections at the end surface 40.

In exemplary embodiments, the two Bragg gratings 20, 22 provide different reflectivities. Exemplary maximum reflectivities are between about 0.50 and about 0.95.

Figure 3:
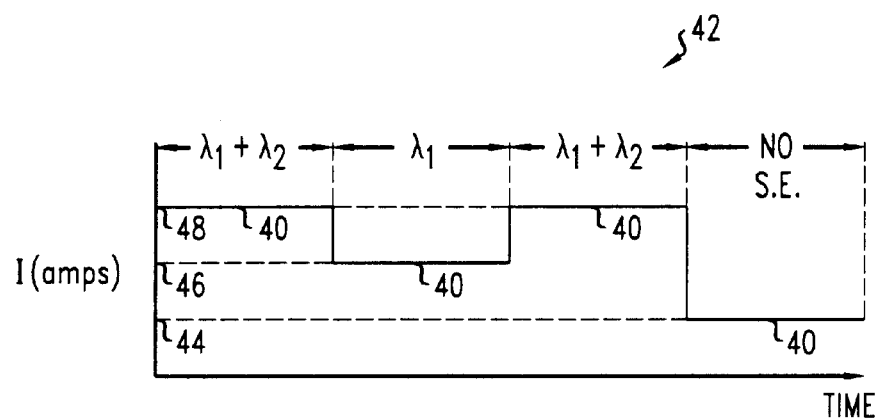
FIG. 3 is a time line illustrating a particular pump current in the laser's gain medium and associated lasing wavelengths.

FIG. 3 is a graph 40 of a particular time-dependent pump current applied between terminals 32, 34 of laser 10, shown in FIG. 1. FIG. 3 also shows the corresponding optical response for the various pump currents. Below a threshold pump current 44, the laser 10 produces only spontaneous emission light, i.e., no sustained stimulated emission (S.S.E.), because cavity losses surpass the power provided by the pumping current. At a higher pump current 46, the laser 10 lases at wavelength $\lambda_1$, because the propagation loss rates are lower than the pumping power for wavelength $\lambda_1$. At a higher pump current 48, the laser 10 lases at both wavelength $\lambda_1$ and wavelength $\lambda_2$, because the pumping power is larger than average propagation loss rates for both wavelengths $\lambda_1$ and $\lambda_2$.

Combined losses in waveguide 14, 16 control output wavelengths of laser 10. If losses for a wavelength are too large, lasing does not occur at that wavelength. Some embodiments introduce variable losses to stop lasing at $\lambda_1$ for pump currents 40, 48 of FIG. 3. The variable losses may be in internal waveguide 16 or in external waveguide 14. For example, a spectrally dependent beam splitter can be used to eliminate optical feedback at wavelength $\lambda_1$ when the laser 10 is pumped with currents 40, 48. Then, the laser 10 lases only at wavelength $\lambda_2$ for the currents 40, 48.

Various geometrical arrangements of Bragg gratings produce other external cavity lasers with advantageous features.

Figure 4:
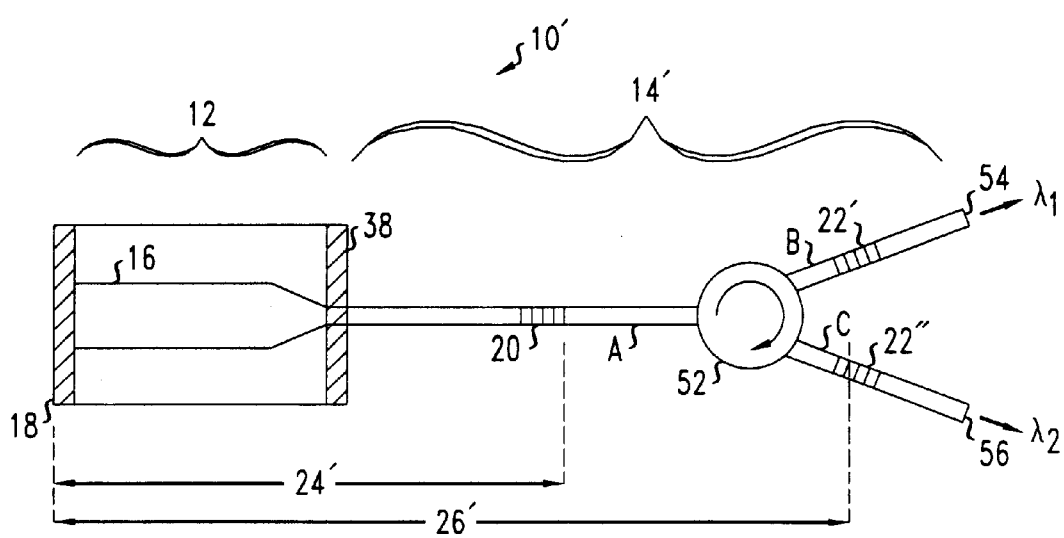
FIG. 4 shows another external cavity laser that uses an optical circulator to enable sharing of one optical gain medium by two laser cavities.

FIG. 4 shows an alternate external cavity laser 10'. In the laser 10', external waveguide 14' includes waveguide arms A–C and optical circulator 52. The optical circulator 52 directs light from waveguide arm A to waveguide arm B, from waveguide arm B to waveguide arm C, and from waveguide arm C back to waveguide arm A. The waveguide arm A includes a Bragg grating 20 whose characteristic reflection wavelength is $\lambda_{B1}$. The waveguide arms B and C include Bragg gratings 22', 22", which have equal characteristic reflection wavelengths $\lambda_{B2}$.

Laser 10' is able to simultaneously lase at wavelengths $\lambda_1$ and $\lambda_2$, because Bragg grating 20 has a different characteristic reflection wavelength than gratings 22', 22". Lasing at wavelength $\lambda_1$ occurs in cavity 24' whose external includes a portion of waveguide arm A and grating 20. Lasing at wavelength $\lambda_2$ occurs in a cavity 26' whose external portion includes waveguide arms A–C, circulator 52, and Bragg gratings 22', 22".

In laser 10', Bragg grating 22' is a high quality reflector, e.g., reflecting 95%–99% of the incident light of wavelength $\lambda_2$. Due to the selective high reflectivity, the grating 22' reflects almost all light of wavelength $\lambda_2$ back to the optical circulator 52, and thus, output port 54 transmits almost exclusively light at wavelength $\lambda_1$. Even when the laser 10' lases at both wavelengths $\lambda_1$ and $\lambda_2$, about 95–99% of the light intensity at port 54 is at wavelength $\lambda_1$.

In laser 10', Bragg grating 22" is a relatively lower quality reflector, e.g., reflecting 50%–80% of the incident light of wavelength $\lambda_2$ Due to the lower reflectivity, output port 56 transmits light at wavelength $\lambda_2$ with a significant intensity when the laser 10' lases at both wavelengths $\lambda_1$ and $\lambda_2$. The output port 56 does not transmit significant amounts of light at wavelength $\lambda_1$, because waveguide arm C only transmits light that is incident onto optical circulator 52 from waveguide arm B. Very little light at wavelength is reflected by Bragg grating 22' back to the circulator 52 via waveguide arm B.

Thus, optical circulator 52 enables external cavity laser 10' to produce substantially monochromatic output light at ports 54 and 56 even when simultaneously lasing at two wavelengths $\lambda_1$ and $\lambda_2$.

Figure 5:
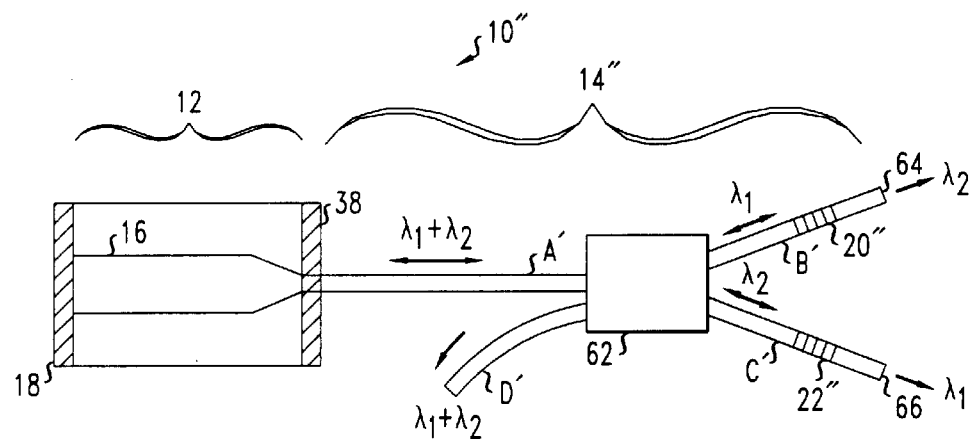
FIG. 5 shows another external cavity laser that uses a Y-coupler to enable two laser cavities to share one gain medium.

FIG. 5 shows another external cavity laser 10". In the laser 10", external waveguide 14" includes optical fiber arms A'–C' and a fiber Y-coupler 62, which directs light from fiber arm A' to both fiber arms B' and C'. The fiber arms B, C' include Bragg grating 20" and 22", which reflect light at wavelengths $\lambda_1$ and $\lambda_2$, respectively. Both gratings 20" and 22" are high quality reflectors, e.g., reflecting 95%–99% of incident light at respective peak wavelengths $\lambda_1$ and $\lambda_2$. Due to the high reflectivity of gratings 20" and 22", output port 64 and output port 66 transmit almost exclusively light at wavelength $\lambda_2$ and $\lambda_1$ respectively. For example, more than 95% of the intensity at each port 64, 66 is only of one wavelength even when the laser 10" lases at both wavelengths $\lambda_1$ and $\lambda_2$.

Those of skill in the art know how to construct fiber Y-coupler 62. The construction typically includes partially denuding segments of two optical fibers of cladding layers and positioning the two denuded segments adjacent and parallel to each other. The construction produces a device having four coupled fiber arms A'–D'. Fiber arm D' serves as a monitoring arm for optical intensities lasing in the laser 10".

Exemplary external cavity lasers are able to simultaneously lase at more than two wavelengths.

Figure 6:
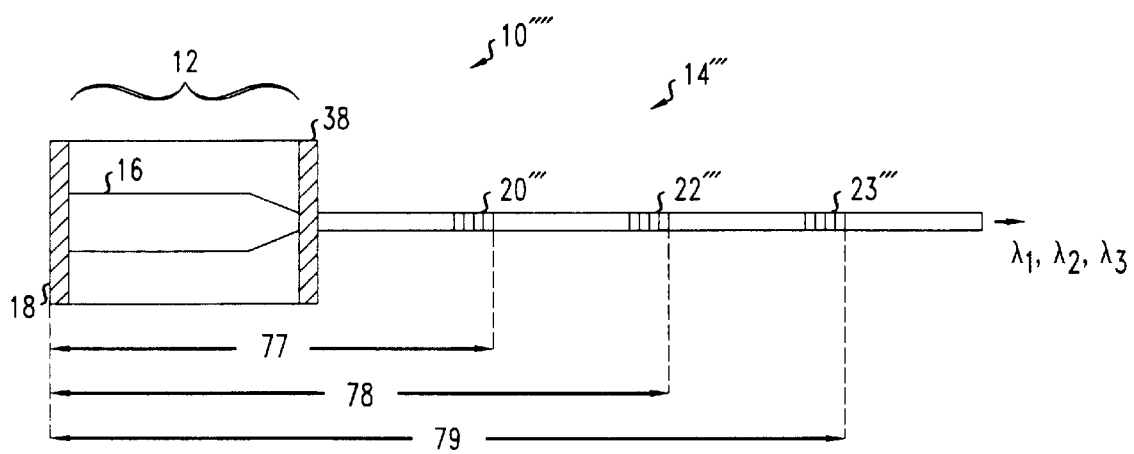
FIG. 6 shows another external cavity laser in which more than two laser cavities share a common gain medium.

FIG. 6 shows an external cavity laser 10"" that can lase at wavelengths $\lambda_1$, $\lambda_2$, and $\lambda_3$ in response to appropriate pump currents. In the laser 10"", an external optical fiber 14"" includes three Bragg gratings 20'", 22'", 23'" with different characteristic reflection wavelengths. Thus, Bragg gratings 20'", 22'", 23'" form laser cavities 77–79 that sustain stimulated emission at a different wavelength $\lambda_1$, $\lambda_2$ and $\lambda_3$.

Various embodiments use external cavity lasers 10, 10', 10", 10"" of FIGS. 1, 4–6 as light sources in transmitters for wavelength division multiplexed (WDM) optical networks. The lasers 10, 10', 10", 10"" produce output light for more than one wavelength channel of the WDM network based on a single pumped gain medium. Thus, using these lasers 10, 10', 10", 10"" can simplify transmitter designs and reduce transmitter costs in WDM networks.

Figure 7:
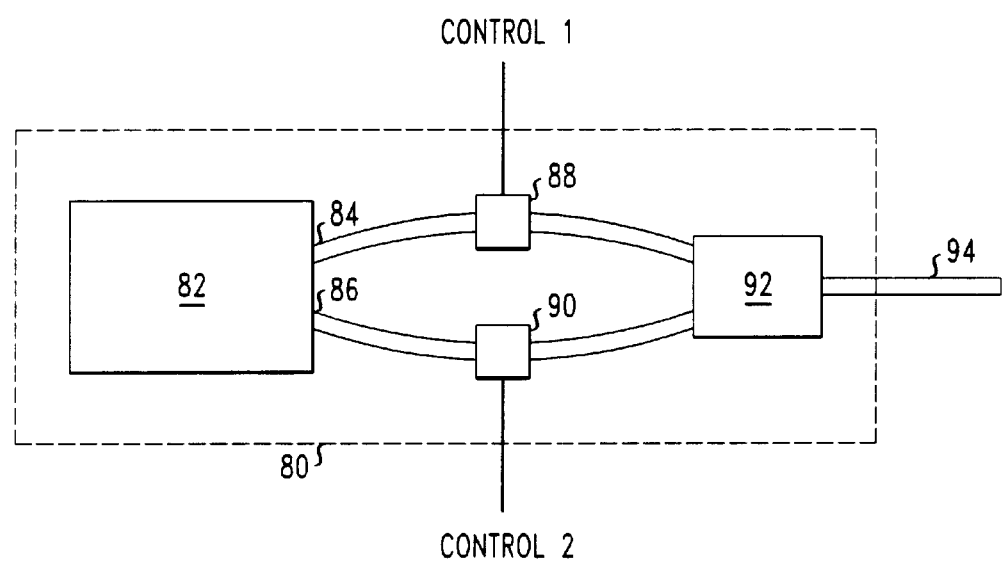
FIG. 7 shows a multi-chromatic optical transmitter for a WDM system that is based on one of the lasers of FIGS. 1, 4, 5, or 6.

FIG. 7 shows a transmitter 80 for a WDM network. The transmitter 80 includes an external cavity laser 82 adapted to simultaneously lase at wavelengths $\lambda_1$ and $\lambda_2$ when properly pumped, e.g., laser 10' of FIG. 4. The laser 82 produces output light of wavelength $\lambda_1$ and $\lambda_2$ at output port 84 and output port 86, respectively. Optical fibers couple the ports 84, 86 to input ports of optical intensity modulators 88, 90, e.g., electrically controlled attenuators. Optical fibers couple output ports of the intensity modulators 88, 90 to a 2×1 fiber combiner 92 that couples the transmitter 80 to a transmission fiber 94 of the WDM network.

The wavelengths $\lambda_1$ and $\lambda_2$ correspond to two separate wavelength channels of the WDM network. Thus, intensity modulators 88, 90 can be independently controlled so that transmitter 80 transmits data simultaneously on two wavelength channels of the WDM system.

Some embodiments of WDM transmitters produce output optical signals from external cavity lasers described herein by modulating pump currents in the shared gain medium of the lasers.

Other embodiments of the invention will be apparent to those skilled in the art in light of the specification, drawings, and claims disclosed herein.

What is claimed is:

1. A laser, comprising:
   an external cavity laser having first and second laser cavities, the first and second cavities sharing a common optical gain medium and being constructed to lase at different wavelengths; and
   an optical circulator;
   wherein the first laser cavity includes a first grating; the second laser cavity includes a second grating; and the first and second gratings have different characteristic reflection wavelengths; and
   wherein one of the cavities includes portions of multiple arms of the optical circulator.

2. The laser of claim 1, wherein
   the first laser cavity further comprises a first silica-glass waveguide and a semiconductor waveguide that includes the gain medium; and
   the second laser cavity further comprises a second silica-glass waveguide and the semiconductor waveguide.

3. The laser of claim 2, wherein each silica-glass waveguide includes one or more optical fibers.

4. The laser of claim 2, wherein each silica-glass waveguide includes one or more planar waveguides.

5. The laser of claim 1, wherein the first and second gratings are serially cascaded.

6. The laser of claim 1, wherein the first and second gratings are Located on different arms of the optical circulator.

7. The laser of claim 6, further comprising a third grating located on a different arm of the optical circulator than the first and second gratings, the third grating configured to reflect light at the same characteristic wavelength as the second grating.

8. A laser, comprising:
   a laser cavity capable of generating laser light, the laser cavity having an internal semiconductor waveguide and an external portion including a silica-glass waveguide, the waveguides being linearly coupled, the silica-glass waveguide being coupled to cascaded first and second wavelength-selective reflectors that reflect light at first and second lasing wavelengths, respectively; and
   an optical circulator; and
   wherein the first and second reflectors are Bragg gratings with first and second periods, respectively; and
   wherein the external portion includes a portion of the optical circulator between two arms of the optical circulator.

9. The laser of claim 8, wherein the silica-glass waveguide includes one or more optical fibers.

10. The laser of claim 9, wherein one of the gratings is located in the one or more optical fibers.

11. The laser of claim 8, wherein the internal semiconductor waveguide includes a pumpable optical gain medium.

12. The laser of claim 11, further comprising:
    a reflector positioned to reflect light incident from the internal semiconductor waveguide.

13. The laser of claim 8, wherein the first and second gratings are located on different arms of the optical circulator.

14. The laser of claim 13, further comprising a third grating located on a different arm of the optical circulator than the first and second gratings, the third grating configured to reflect light at the same characteristic wavelength as the second grating.

15. An optical transmitter, comprising:
    an external cavity laser having first and second laser cavities, the first and second cavities sharing a single optical gain medium and being constructed to lase at least at first and second wavelengths; and
    a modulator coupled to the laser and capable of modulating output intensities of the laser at the first and second wavelengths;
    an optical circulator; and
    wherein the laser further comprises a semiconductor optical waveguide that includes the optical gain medium; and
    wherein the first cavity includes a first silica-glass waveguide, the semiconductor optical waveguide, and a first grating and the second cavity includes a second silica-glass waveguide, the semiconductor optical waveguide, and a second grating; and
    wherein the first and second gratings having different characteristic reflection wavelengths and the second cavity includes portions of multiple arms of the optical circulator.

16. The optical transmitter of claim 15, wherein the modulator includes first and second controllable attenuators coupled to first and second output ports of the laser, the first and second ports configured to output laser light at the first and second wavelengths, respectively.

17. The optical transmitter of claim 15, wherein the silica-glass waveguides include portions of one or more optical fibers.

18. The optical transmitter of claim 15, wherein the silica-glass waveguides include portions of one or more planar waveguides.

19. The laser of claim 15, wherein the first and second gratings are located on different arms of the optical circulator.

20. The laser of claim 19, further comprising a third grating located on a different arm of the optical circulator than the first and second gratings, the third grating configured to reflect light at substantially the same characteristic wavelength as the second grating.

* * * * *